(12) United States Patent
Keaveney et al.

(10) Patent No.: US 6,897,690 B2
(45) Date of Patent: May 24, 2005

(54) CHARGE PUMP SYSTEM FOR FAST LOCKING PHASE LOCK LOOP

(75) Inventors: Michael F. Keaveney, Lisnagry (IE); Colin Lyden, Baltimore (IE); Patrick Walsh, Dooradoyle (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/874,641

(22) Filed: Jun. 23, 2004

(65) Prior Publication Data

US 2005/0024106 A1 Feb. 3, 2005

Related U.S. Application Data

(60) Provisional application No. 60/483,411, filed on Jun. 27, 2003, and provisional application No. 60/544,439, filed on Feb. 14, 2004.

(51) Int. Cl.[7] .............................................. H03L 7/06
(52) U.S. Cl. ..................................... 327/148; 327/157
(58) Field of Search ................................ 327/148, 149, 327/147, 156, 157; 331/17, 25, DIG. 2; 375/373, 374, 376

(56) References Cited

U.S. PATENT DOCUMENTS

| | | | | |
|---|---|---|---|---|
| 4,156,855 A | | 5/1979 | Crowley | 331/1 A |
| 5,889,828 A | * | 3/1999 | Miyashita et al. | 375/374 |
| 6,111,470 A | | 8/2000 | Dufour | 331/17 |
| 6,230,280 B1 | * | 5/2001 | Okasaka | 713/400 |

OTHER PUBLICATIONS

Rhee, W., "Design of High–Performance CMOS Charge Pums in Phase–Locked Loops", IEEE International Symposium on Circuits and Systems (ISCAS), 1999, vol. 2, pp. 545–548.

"An Analysis and Performance Evaluation of a Passive Filter Design Technique for Charge Pump PLL's", National Semiconductor Application Note 1001, Jul. 2001, pp. 1–8.

Byrd, et al. "A Fast Locking Scheme for PLL Frequency Synthesizers", National Semiconductor Application Note 1000, Jul. 1995, pp. 1–6.

Curtin et al. "Phase Locked Loops for High–Frequency Receivers and Transmitters–Part 3", Analog Dialogue 33–7 (1999), pp. 1–5.

Rhee et al., "A 1.1–GHz CMOS Fractional–$N$ Frequency Synthesizer with a 3–b Third–Order Delta Sigma Modulator"; IEEE Journal of Solid–State Circuits, vol. 35, No. 10, Oct. 2000, pp 1453–1460.

Greshishchev et al., "SiGe Clock and Data Recovery IC with Linear–Type PLL for 10–Gb/s SONET Application"; IEEE Journal of Solid–State Circuits, vol. 35, No. 9, Sep. 2000, pp 1353–1359.

Bastos et al., "A 12–Bit Intrinsic Accuracy High–Speed CMOS DAC"; IEEE Journal of Solid–State Circuits, Vo. 33, No. 12, Dec. 1998, pp. 1959–1969.

* cited by examiner

*Primary Examiner*—Linh My Nguyen
(74) *Attorney, Agent, or Firm*—Iandiorio & Teska

(57) ABSTRACT

A charge pump system for a fast locking phase lock loop includes a set n of charge pump units; and a control logic circuit for enabling the set of n charge pump units to produce up and down charge pulses with a nominal charge pump mismatch in a wide bandwidth mode; and in a narrow bandwidth mode enabling at least a subset of the n charge pump units sequentially to produce an average charge pump mismatch in narrow bandwidth mode that matches the nominal charge pump mismatch in the wide bandwidth mode.

18 Claims, 6 Drawing Sheets

CHARGE PUMP SYSTEM FOR FAST LOCKING PHASE LOCK LOOP

RELATED APPLICATIONS

This application claims the benefit of U.S. Provisional Application No. 60/483,411 filed Jun. 27, 2003, and U.S. Provisional Application No. 60/544,439 filed Feb. 14, 2004 both incorporated by reference herein.

FIELD OF THE INVENTION

This invention relates to an improved charge pump system for a fast locking phase lock loop and more particularly to such a system which matches the charge pump mismatch in narrow bandwidth mode with that in wide bandwidth mode.

BACKGROUND OF THE INVENTION

Fast lock time and low phase noise/spurious are desirable properties in a PLL based synthesizer. However, these are conflicting requirements as fast lock time calls for a wide loop bandwidth whereas low phase noise and spurious calls for a narrow loop bandwidth. A well known approach is to use a wide loop bandwidth initially to lock the loop quickly and then, after the loop has settled, revert to a narrow loop bandwidth for low noise and spurious. Wide loop bandwidth is achieved by increasing the charge pump current by the square of the bandwidth increase, e.g. a 64× charge pump current, Icp, increase for an 8× bandwidth increase. Icp is reduced back to 1× for narrow bandwidth. The 64× increase can be implemented by activating 64 nominally identical charge pump cells or circuits with just one cell or circuit active in narrow bandwidth mode. Prior art fast lock PLLs, based on the dual bandwidth technique suffer from excessively large phase disturbance when the loop bandwidth is reduced. This disturbance is slow to settle out in narrow bandwidth mode, thus the full potential for lock time improvement is not realized. A major contributor to this phase disturbance seems to be the phase step that results with a change in charge pump mismatch when the charge pump current is reduced to 1×. The PLL locks with just enough static phase error to cancel the error due to charge pump up to down mismatch. If the charge pump mismatch in 1× is different from the average mismatch of all elements that are active when the loop has settled in wide bandwidth mode then there will be a corresponding change in the amount of static phase error required to restore the balance when Icp is reduced to 1×.

BRIEF SUMMARY OF THE INVENTION

It is therefore an object of this invention to provide an improved charge pump system for a fast locking phase lock loop (PLL).

It is a further object of this invention to provide such a charge pump system which matches the current pulse mismatch in a wide bandwidth mode and a narrow bandwidth mode.

It is a further object of this invention to provide such a charge pump system which matches the static phase error in the wide bandwidth mode and the narrow bandwidth mode.

It is a further object of this invention to provide such a charge pump system which minimizes the disturbance in phase when switching from wide bandwidth mode to narrow bandwidth mode.

It is a further object of this invention to provide such a charge pump system which keeps the change in phase below 5 degrees compared with tens of degrees in conventional charge pump systems and PLLs.

The invention results from the realization that a truly improved charge pump system which reduces the change in phase in a PLL when switching from wide bandwidth mode to narrow bandwidth mode can be achieved by using in the narrow bandwidth mode one at a time sequentially some or all of the charge pump units that were combined to produce the high current during the wide bandwidth mode so that the average charge pump mismatch in the narrow bandwidth mode matches the nominal charge pump mismatch in the wide bandwidth mode; and the further realization that the mismatch between wide and narrow bandwidth modes can also be reduced by choosing for the narrow bandwidth mode a charge pump unit or units whose charge pump mismatch is closest to the nominal charge pump mismatch in the wide bandwidth mode.

The subject invention, however, in other embodiments, need not achieve all these objectives and the claims hereof should not be limited to structures or methods capable of achieving these objectives.

This invention features a charge pump system for a fast locking phase lock loop including a set of n charge pump units. There is a control logic circuit for enabling the set of n charge pump circuits to produce up and down charge pulses with a nominal charge pump mismatch in a wide bandwidth mode and in a narrow bandwidth mode enabling at least a subset of the n charge pump units sequentially to produce an average charge pump mismatch in narrow bandwidth mode that matches the nominal charge pump mismatch in the wide bandwidth mode.

In a preferred embodiment, the control logic circuit sequentially enables m of the charge pump units at a time where m<n. m may be equal to one. The control logic circuit may sequentially enable the entire set n of the charge pump units. The control logic may enable the at least one subset of the n charge pump units randomly to produce an average charge pump mismatch in narrow bandwidth mode that matches the nominal charge pump mismatch in the wide bandwidth mode.

The invention also features a charge pump system for a fast locking phase lock loop including a set of n charge pumps units and a control logic circuit for enabling the set of n charge pump units to produce up and down charge pulses with a nominal charge pump mismatch in a wide bandwidth mode and in a narrow bandwidth mode enabling at least one of the charge pump units whose charge pump mismatch is close to the nominal charge pump mismatch in the wide bandwidth mode.

In a preferred embodiment, the control logic circuit may enable the charge pump unit whose charge pump mismatch is closest to the nominal charge pump mismatch. There may be a calibration circuit for determining which of the charge pump units has a charge pump mismatch which is closest to the nominal charge pump mismatch in the wide bandwidth mode. The calibration current may include a phase detector for detecting the phase error in wide bandwidth mode and for each charge pump unit in narrow bandwidth mode, and a comparator for identifying a charge pump unit whose charge pump mismatch is close to the nominal charge pump mismatch. The calibration circuit may include a phase detector for detecting the phase error in the wide bandwidth mode and for each charge pump unit in narrow bandwidth mode, and a comparator for identifying a charge pump unit whose resulting phase lock loop output phase error is closest to the output phase error when all charge pump units are active.

This invention also features a charge pump system for a fast locking phase lock loop (PLL) including, a set n of charge pump units; and a control logic circuit for enabling the set of n charge pump units to produce up and down charge pulses with a nominal PLL output phase error in a wide bandwidth mode and in a narrow bandwidth mode enabling at least one of the charge pump units whose PLL output phase error is close to the nominal PLL output phase error in the wide bandwidth mode.

In one embodiment, the control logic circuit may enable the charge pump unit whose PLL output phase error is closest to the nominal PLL output phase error. There may be a calibration circuit for determining which of the charge pump circuits has a PLL output phase error close to the nominal PLL output phase error in the wide bandwidth mode. The calibration circuit may include a phase detector for detecting the phase error in wide bandwidth mode and for each charge pump unit in narrow bandwidth mode, and a comparator for identifying a charge pump unit whose PLL output phase error is closest to the nominal PLL output phase error.

This invention further features a charge pump system for a fast locking phase lock loop including a set of n charge pump units, and a control logic circuit for enabling the set of n charge pump units to produce up and down charge pulses with a nominal charge pump mismatch in a wide bandwidth mode and in a narrow bandwidth mode enabling at least one subset of the n charge pump units randomly to produce an average charge pump mismatch in narrow bandwidth mode that matches the nominal charge pump mismatch in the wide bandwidth mode.

In one embodiment, the control logic circuit may randomly enable m of said charge pump units at a time where m<n. The control logic circuit may randomly enable m of said charge pump units at a time where m=1. The control logic circuit may randomly enable the entire set of n of said charge pump units.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
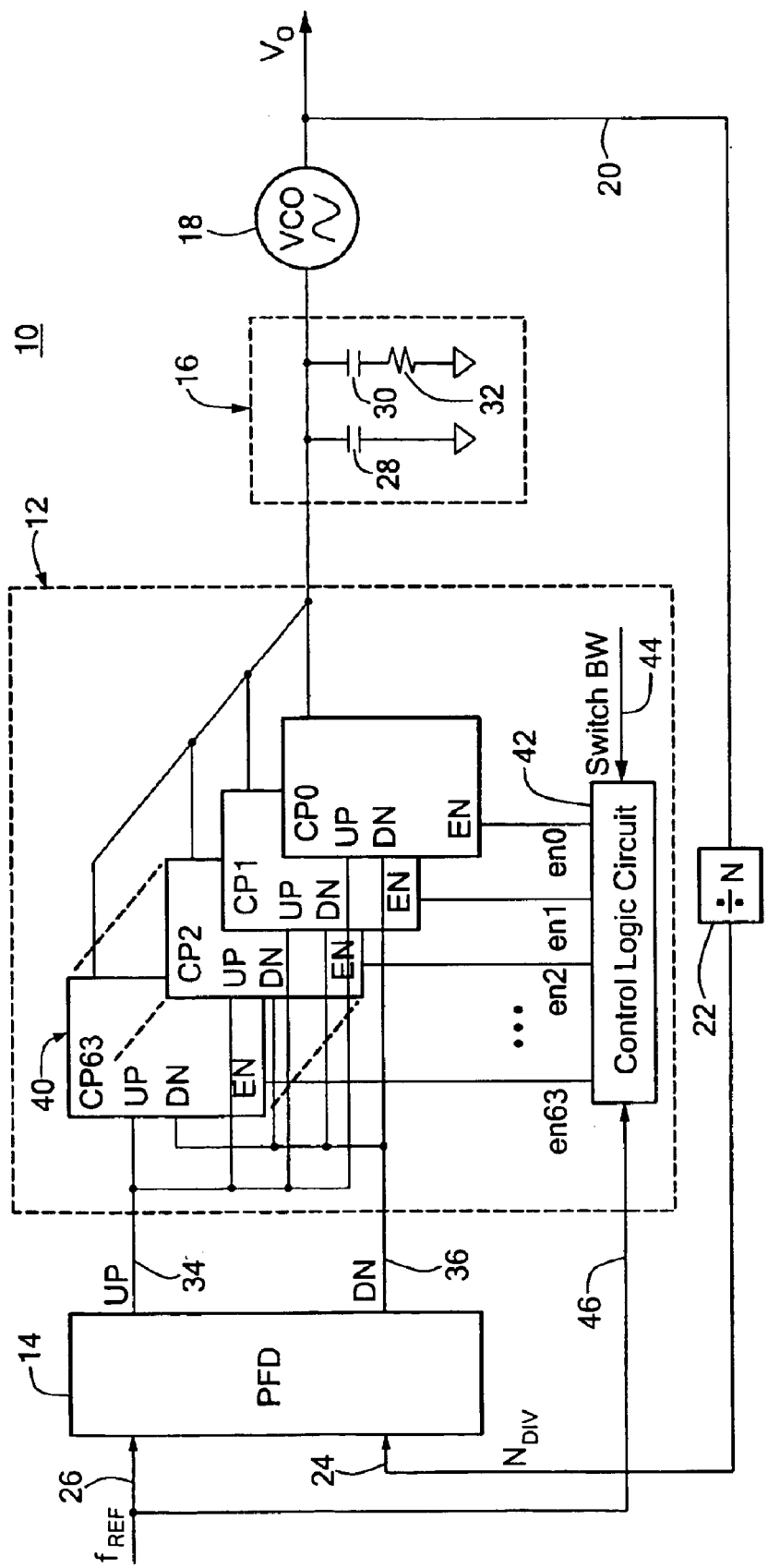
FIG. 1 is a schematic block diagram of a phase lock loop employing a sequential charge pump system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a phase lock loop circuit 10 including a charge pump system 12 according to this invention. Phase lock loop circuit (PLL) includes a phase frequency detector 14, loop filter 16, and voltage control oscillator 18. There is a feedback loop 20 which may include a divide by N circuit 22 whose output $N_{div}$ provides one input 24 to phase frequency detector 14. The other input 26 is the reference signal $f_{ref}$. Loop filter 16 includes capacitors 28 and 30 and resistor 32.

In operation the output of voltage control oscillator 18 is fed back either directly or through divide by N circuit 22 to the input 24 of phase frequency detector 14. Phase frequency detector 14 compares the $f_{ref}$ input on 26 with the feedback signal on input 24. A phase difference causes up outputs 34 and down outputs 36 to drive charge pump system 12 to provide charge up pulses or charge down pulses to loop filter 16. Charge up pulses increase the voltage out of loop filter 16 and cause the voltage control oscillator 18 to increase its output frequency, whereas a down pulse charge causes VCO 18 to produce an output of lower frequency. This continues until the inputs 24 and 26 are balanced at phase frequency detector 14.

In accordance with this invention charge pump system 12 includes a set of n charge pump units. In FIG. 1 n is equal to 64 and there are 64 charge pump units identified as CP 0 through CP 63. Each one selectively receives up and down pulses from lines 34 and 36, and an enable pulse from control logic circuit 42. PLL 10 can switch between wide bandwidth mode and narrow bandwidth mode in accordance with a signal at wide bandwidth mode input 44. For example, a high level at input 44 might indicate wide bandwidth mode whereas a low level would indicate narrow bandwidth mode. In the wide bandwidth mode control logic circuit 42 which also receives an input from $f_{ref}$ on line 46 enables all 64 of the charge pump units CP 0–CP 63 at one time. Each unit ideally produces the same amount of current so that in the wide bandwidth mode the output current to loop filter 16 will be 64 times the unit output current. In narrow bandwidth mode charge pump units CP 0–CP 63 are enabled one at a time sequentially so that the output current to loop filter 16 is now 1/64 of that during the wide bandwidth mode. Making n equal to 64 in this case is completely arbitrary. For purposes of this example it is assumed that the differences between the wide bandwidth and low bandwidth mode is a factor of 8 and therefore in accordance with convention the difference of current in those two modes should differ by a factor of $8^2$ or 64 but this in not a necessary condition of the invention. The system switches between the wide bandwidth mode and the narrow bandwidth mode, normally being in wide mode for e.g. 10 usec, and narrow mode for e.g. 570 μsec.

Figure 2:
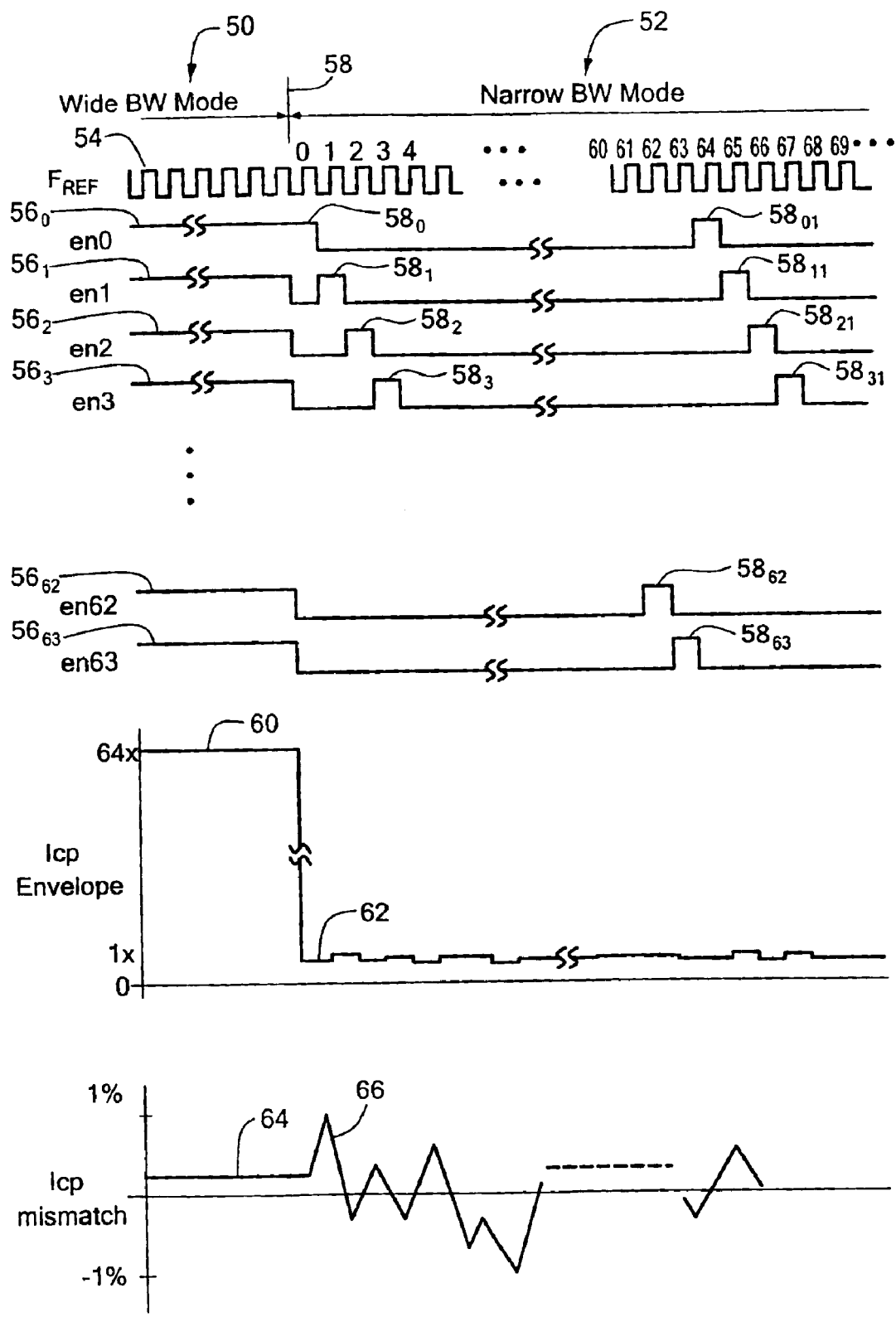
FIG. 2 shows a number of waveforms illustrating the operation of the charge pump system of FIG. 1.

The operation of the charge pump system 12 of FIG. 1 can be better understood with reference to the waveforms illustrated in FIG. 2 which are drawn during a portion of the wide bandwidth mode 50 and narrow bandwidth mode 52. $f_{ref}$ 54 is a signal of typically e.g. 26 MHz. The enable inputs of charge pump units CP 0–CP 63 are shown to be high signals 56₀–56₆₃ during the entire wide bandwidth mode 50 but during the narrow bandwidth mode, the transition to which occurs at 58, only one of the set of 64 charge pump units 40 is enabled. Thus during the 0 cycle of $f_{ref}$ 54 first following the transition 58 the enable input to charge pump unit CP 0 is high at 58$_0$. Although in this embodiment the counter (e.g. counter 70, FIG. 3 discussed below) is responsive to the negative edge of $f_{ref}$ with the rising edge being the active edge at PFD 14, FIG. 1, this is not a necessary limitation of this invention as these polarities are arbitrary and may be reversed. The only requirement is that the desired charge pump unit is enabled and the others disabled with sufficient setup time before PFD 14 is active. During the next cycle, cycle one of $f_{ref}$ 54, FIG. 2, the enable of charge pump unit 0 goes low and the enable of charge pump CP 1 goes high 58$_1$. During the next cycle of $f_{ref}$ 54 the enable inputs of charge pump units CP 0 and CP 1 are low and that of CP 2 is high 58$_2$. The same progression continues at 58$_3$ and through to 58$_{62}$ and 58$_{63}$ whereupon after the 64th cycle of $f_{ref}$ 54 the sequence begins again with 58$_{01}$, 58$_{11}$, 58$_{21}$, 58$_{31}$ and so on. Thus during the wide bandwidth mode 50 the output current $I_{cp}$ of the charge pump system 12 to loop filter 16 remains at 64 units of currents shown at 60 during the entire time because all of the charge pump units CP 0–CP 63 are on all the time. However, after the transition at 58 there is only one of the charge pump units CP 0–CP 63 on at a time and so the output current $I_{cp}$ drops to one unit of current as shown at 62. Since output 60 is formed of a combination of all 64 of the inputs in the wide bandwidth mode 50 it has a constant charge pump mismatch dictated by the range of accuracy of the 64 charge pump units CP 0–CP 63. However, in the narrow bandwidth mode 52 since only one charge pump unit is on at a time. $I_{cp}$ 62 at the time will vary above and below the one unit of current desired. But, since all of the 64 units are used albeit sequentially the average mismatch will be the same. Thus while a charge pump mismatch 64 stays steady through the entire wide bandwidth mode it varies substantially as shown at 66 in the narrow bandwidth mode. However, since all 64 of the charge pump units CP 0–CP 63 are used in the narrow bandwidth mode as well although seriatim instead of in combination the average charge pump mismatch will be the same after 64 cycles.

Since $f_{ref}$ typically has a frequency of e.g. 26 MHz in this case the n of 64 cycles will occur quickly enough (e.g. 2.5 $\mu$sec) so that the slower response of PLL 10 in the narrow bandwidth mode will react to the average output rather than the excursions of each individual output of the sequenced charge pump units CP 0–CP 63.

Although this example in FIGS. 1 and 2 is a very specific one where n the number of charge pumps is 64 and all n or 64 are enabled in the wide bandwidth mode and only one at time is enabled in the narrow bandwidth mode and all of the charge pump units n enabled in the wide bandwidth mode are enabled m at a time where m equals one in the narrow bandwidth mode none of these are limitations of the invention. For example, as indicated previously n may be any number and it doesn't have to strictly comply with the conventional wisdom of being the square of the factor of the bandwidth difference. Further while preferably all of the charge pump units which were simultaneously enabled in the wide bandwidth mode are enabled sequentially in the narrow bandwidth mode, this is not a necessary limitation of the invention: there may be only a subset of the n charge pump units enabled sequentially if that would reduce the mismatch between the wide bandwidth and narrow bandwidth mode operations to a desirable level in any particular application. While the charge pump units are enabled sequentially one at a time in this embodiment, this is not a necessary limitation of the invention: it may be done by averaging two at a time, three at a time, or any number at a time so long as the number enabled at one time m is less than n. The charge pump units may also be enabled in a random selection sequence (discussed below).

Figure 3:
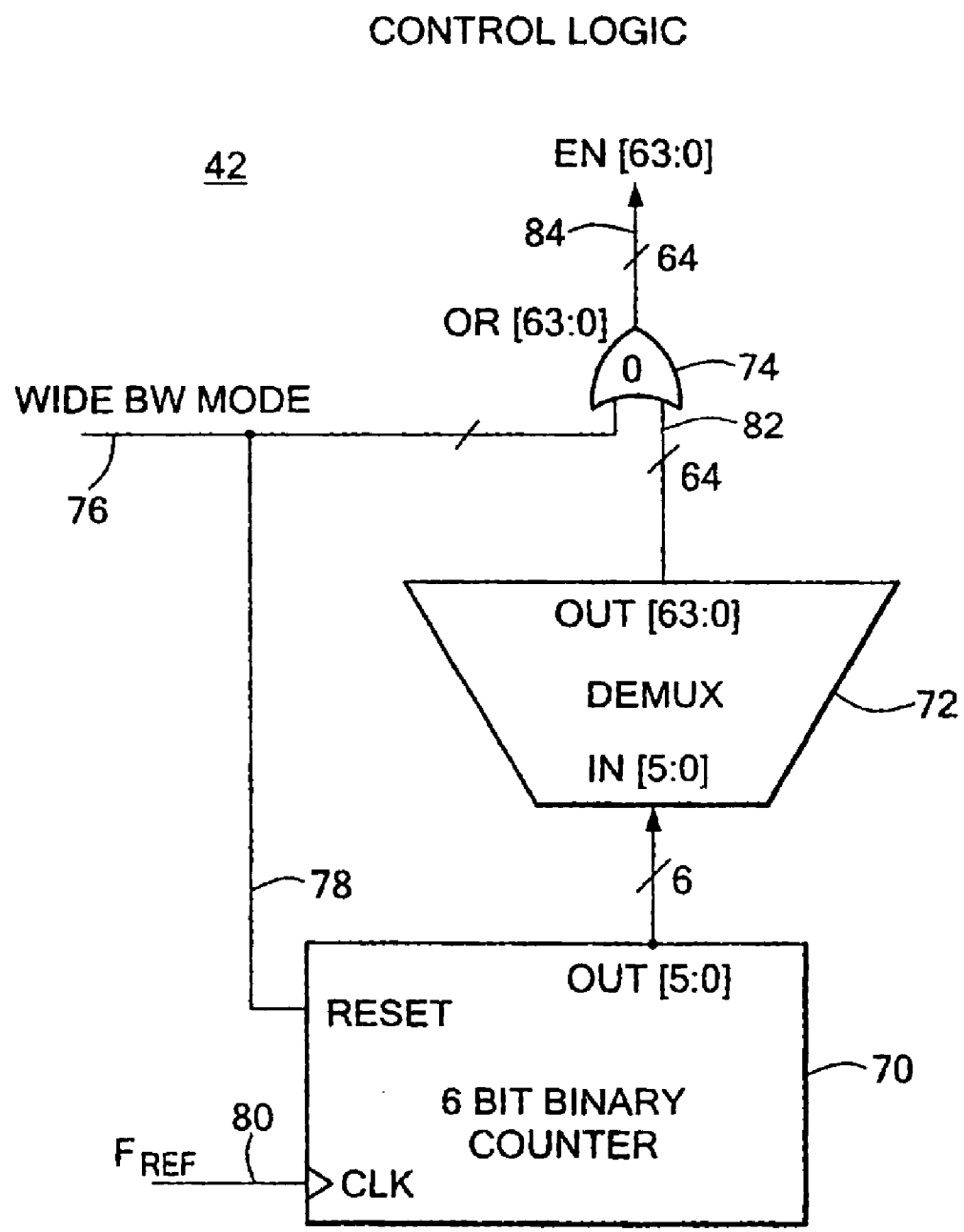
FIG. 3 is a more detailed schematic block diagram of the control logic circuit of FIG. 1 for sequential operation in narrow bandwidth mode.

Control logic circuit 42 is shown in more detail in FIG. 3 as including a six bit binary counter 70, demux circuit 72, and OR gate 74. When a wide bandwidth mode signal is high on line 76, OR gate 74 provides a steady output to all 64 lines enabling all 64 charge pump units simultaneously in the wide bandwidth mode. However when the wide bandwidth mode signal on line 76 goes low there is no steady logic high input to the bank of 64 two-input OR gates 74 and six bit binary counter 70 is released from reset by the low level signal on line 78. Six bit binary counter 70 counts from 0 to 63 because in this case we are using an example where n is equal to 64, thus with it released from reset it now counts the signals from $f_{ref}$ at its clock CLK input 80 and provides to demux circuit 72 a 6 bit input address word each cycle of the $f_{ref}$ clock. Based on this input address demux circuit 72 in turn sequentially enables one of the 64 lines 82 to the 64 OR gates 74 which one at a time over 64 lines 84 enables one of 64 charge pump units.

In one embodiment, the 64 charge pump units may be enabled in a random selection sequence instead of sequentially cycling through the 64 charge pump units in the same order each time. In this example the charge pump unit selection is based on a pseudo-random number generator (not shown) instead of binary counter 70. In this design any spurious energy due to the regular sequence of mismatch errors that result with the binary counter selection will be spread out to resemble white noise.

In another embodiment instead of using each of the charge pump units sequentially in the narrow bandwidth mode in order to obtain the nominal mismatch occurring in the wide bandwidth mode this invention contemplates alternatively using at least one of the charge pump units whose charge pump mismatch is close to the nominal charge pump mismatch in the wide bandwidth mode. Preferably it may enable the charge pump unit whose charge pump mismatch is closest to the nominal charge pump mismatch for optimal results, or it may enable more than one of the charge pump units which when averaged are closest to the nominal charge pump mismatch in the wide bandwidth mode.

Figure 4:
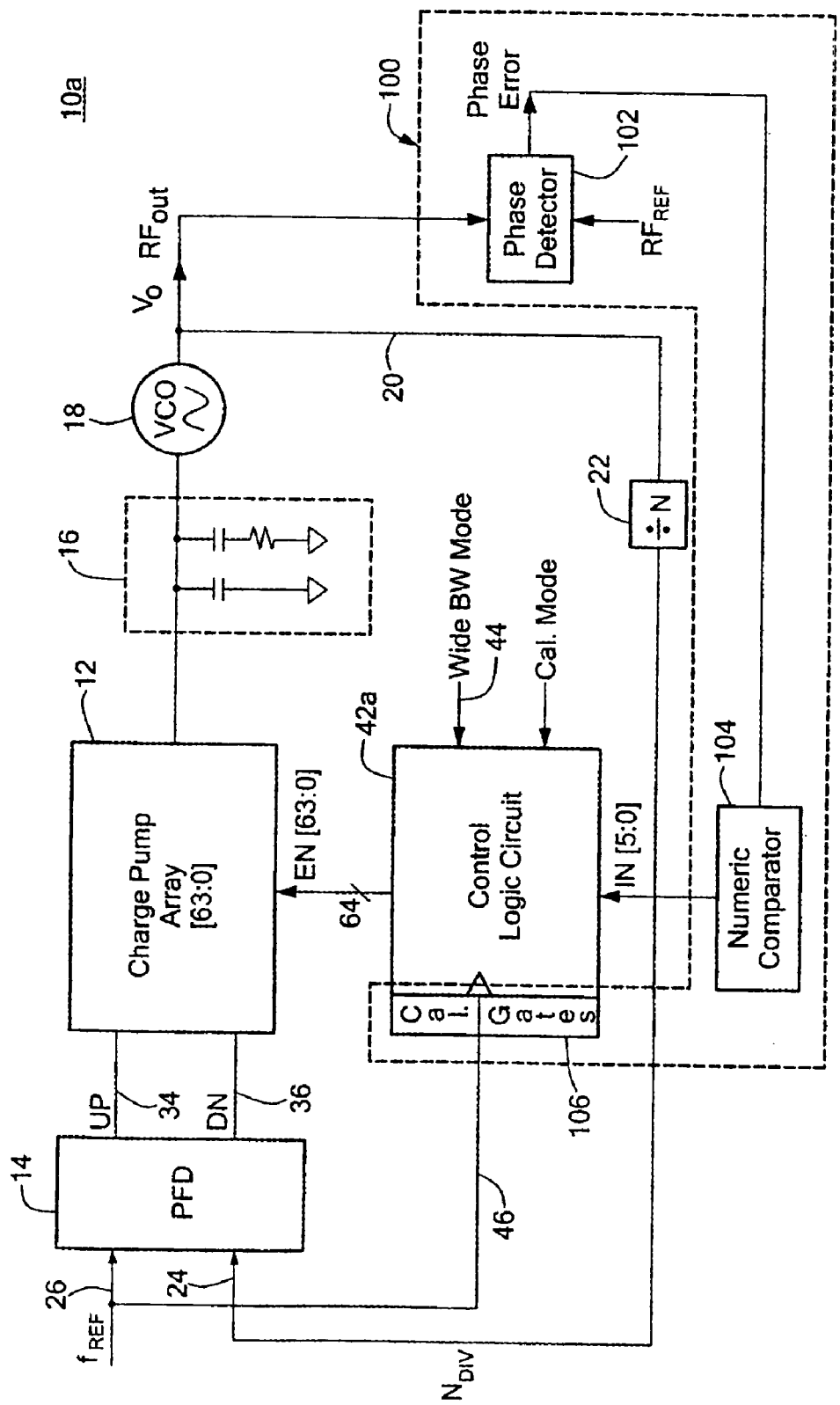
FIG. 4 is a schematic block diagram of a phase lock loop employing an alternative charge pump system according to this invention.

Such a system 10*a*, is shown in FIG. 4, where like parts have been given like numbers and similar parts like numbers accompanied by a lower case letter. System 10*a* includes a calibration system 100 including phase detector 102, numeric comparator 104 and calibration gates 106. In normal operation charge pump system 10*a* operates as previously explained with respect to FIGS. 1, 2 and 3 but in the calibration operation phase detector 102 detects the output phase error of PLL 10 during the wide bandwidth mode of operation and again for each of the charge pump units individually during the narrow bandwidth mode. These phase errors detected are communicated to numeric comparator 104 which determines the one (or group) of the charge pump units with which the output phase error of PLL 10 is close or closest to the output phase error occurring during the wide bandwidth mode. The identity of this one of the charge pump units is loaded into control logic circuit 42*a*. Then, in the narrow bandwidth mode, instead of sequentially using each of the charge pump units, control logic 42*a* uses only the charge pump unit whose identity has been loaded into it from numeric comparator 104. Calibration gates 106 control the calibration operation and the normal operation and the switching between the two.

Figure 5:
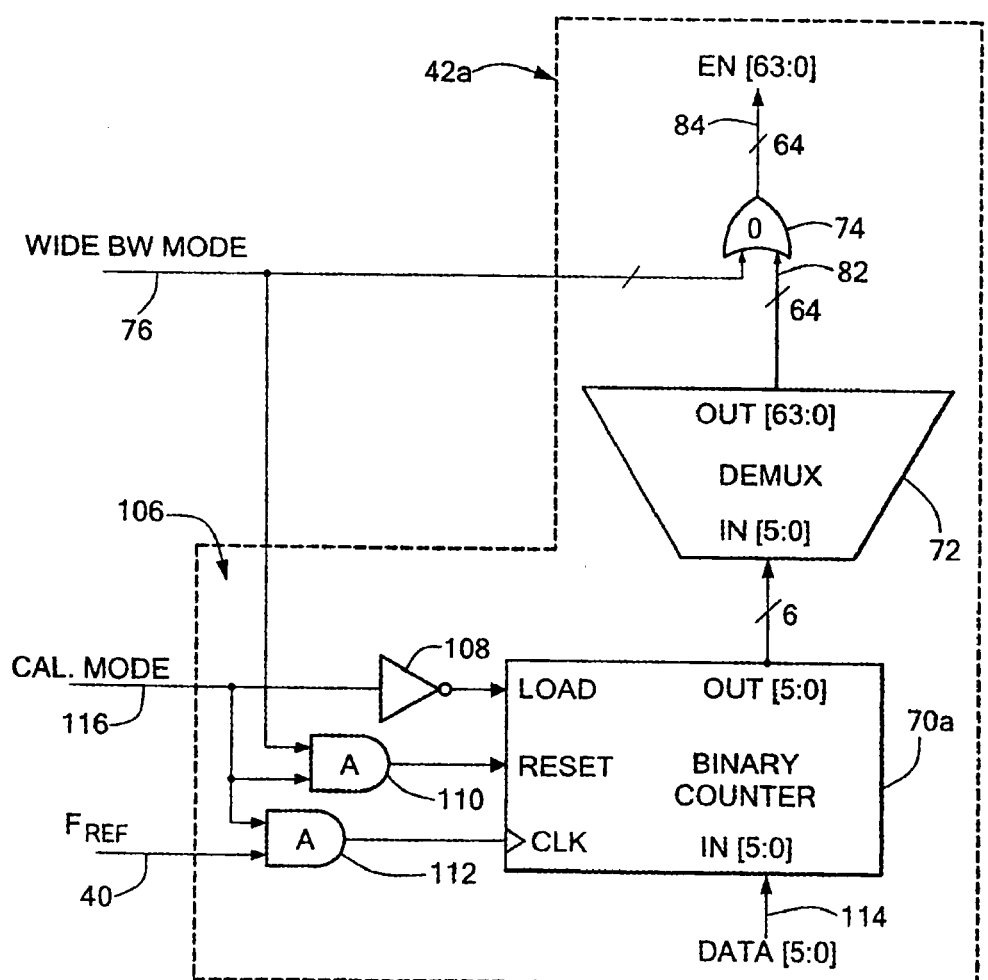
FIG. 5 is a view of a control logic circuit similar to FIG. 3 employed in the charge pump system of FIG. 4.

Calibration gates 106, FIG. 5, include an inverter 108 and two AND gates, 110 and 112. Control logic circuit 42*a* includes bank of OR gates 74 and demux circuit 72 as previously shown with respect to FIG. 1. Counter 70a is the same as counter 70 except that it has a port 114 for excepting data through which the identity of the closest matching charge pump unit from numeric comparator 104 is loaded to the output register (OUT[5:0]) when the LOAD input to 70a is at logic high.

In the calibration mode, with the calibration line 116 enabled, inverter 108 disables the input to counter 70a. The calibration signal on line 116 also provides one input to AND gate 110 and one input to AND gate 112. With $f_{ref}$ occurring steadily on line 46 the output of AND gate 112 is fed directly to the clock input CLK of counter 70a. However, if the wide bandwidth mode signal is present on lines 76 it enables AND gate 110 to place a solid enable signal at the RESET input of counter 78. This keeps a steady zero count in counter 70a regardless of the fact that $f_{ref}$ is being clocked in at the clock input CLK. The only output from the control logic circuit 42a is the solid high at the 64 enable outputs 84 of bank of OR gates 74 generated by the wide bandwidth mode signal on line 76. In this condition phase detector 102 in FIG. 4 determines the phase error in the wide bandwidth mode.

When the signal on wide bandwidth mode line 76 goes low indicating narrow bandwidth mode AND, gate 110 is disabled, disabling the RESET to counter 70a so that counter can now count. With calibration signal on line 116 still high inverter 108 still disables the LOAD input of counter 70a, but now the $f_{ref}$ signals on line 46 can pass through AND gate 112 to the clock input CLK and so demux 72 sequentially applies the enable to each of the charge pump units and phase detector 102 in FIG. 4 determines the phase error resulting from each of them. It is these signals that when compared in numeric comparator 104, provide the identity of the charge pump unit whose resulting phase error is close or closest to the phase error in the wide bandwidth mode as a result of the mismatch of all 64 charge pump units. When the calibration mode is turned off, line 116 goes low; both AND gates 110 and 112 are therefore disabled and inverter 108 now enables the LOAD input to counter 70a. With the LOAD input enabled, counter 70a maintains a steady address word on OUT[5:0] that is equal to the input word on 114, regardless of the state of the CLK input.

Figure 6:
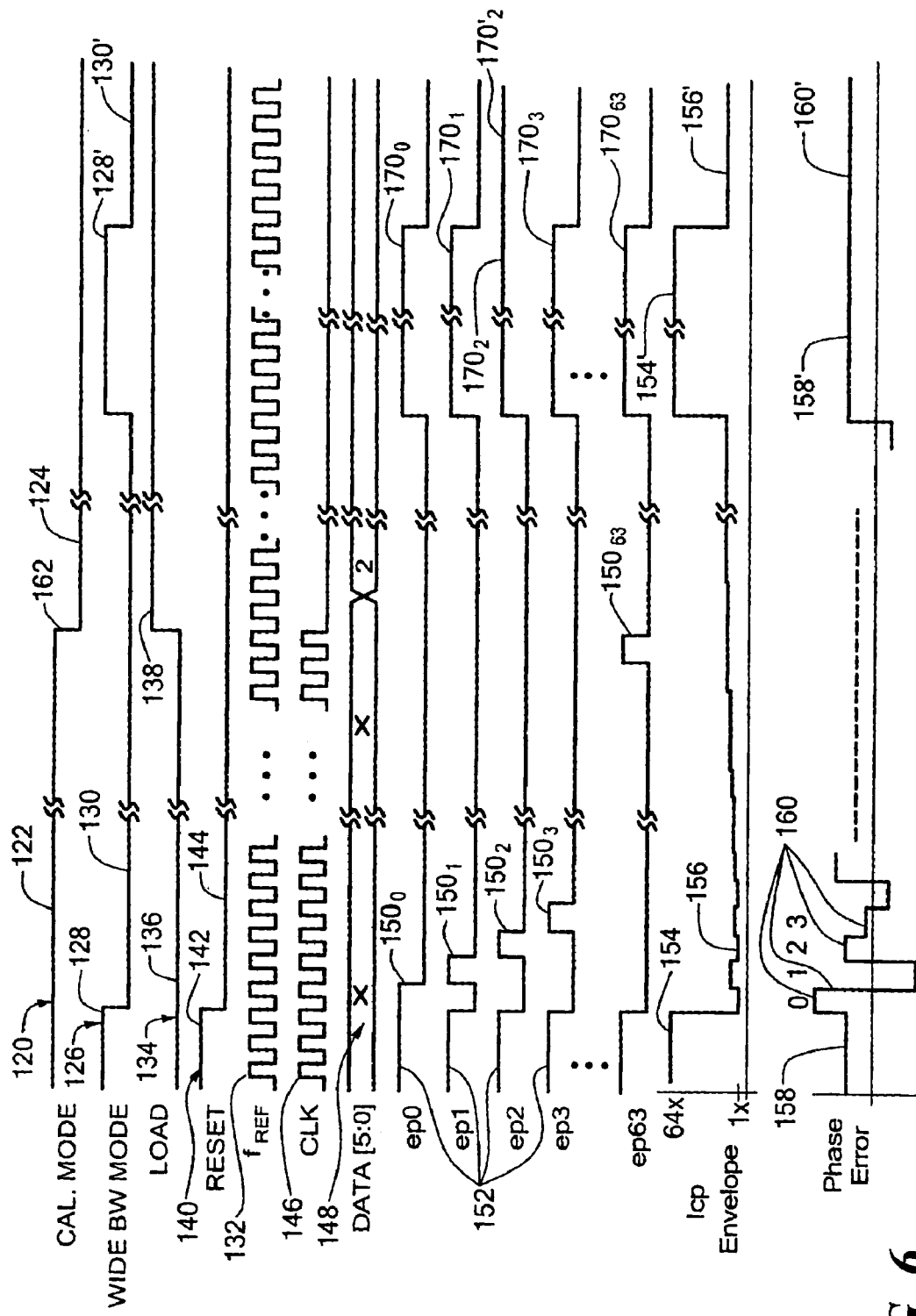
FIG. 6 is a view similar to FIG. 2 showing waveforms illustrating the operation of the charge pump of FIG. 4.

The relationship in operation of the components in FIGS. 4 and 5 is illustrated by the waveforms in FIG. 6. There calibration mode signal 120 is high 122 when on and low 124 when off. Wide bandwidth mode level 126 is high 128 when on and low when in the narrow bandwidth mode 130. $f_{ref}$ 132 is typically always present. As long as calibration signal 120 is high 122 the LOAD signal 134 will be low 136. When the calibration signal goes low or off at 124 the LOAD signal goes high 138; this is due to the operation of inverter 108. In response to the operation of AND gate 110 the RESET signal 140 is high 142 when the calibration signal is high 122 and the wide bandwidth mode signal is low 130. RESET is disabled or low at 144 when either the calibration mode 120 is low 124 or the wide bandwidth mode 126 is low 130. Clock signal CLK 146 is present only so long as the calibration signal 120 is high 122. During the calibration signal since the LOAD is disabled the data input 148 is ignored. Each of the charge pump units CP 0 through CP 63 are enabled and provides an output at sequential cycles of $f_{ref}$ 132 or clock cycle 146, $150_0$, $150_1$, $150_2$, $150_3$, through $150_{63}$. Prior to that while wide bandwidth mode signal 126 is high at 128 all of the 64 charge pump units CP 0 through CP 63 are enabled as shown at 152. As explained previously, during the wide bandwidth mode period the charge pump current $I_{cp}$ at 154 is approximately 64 units while in the narrow bandwidth mode, as shown at 156 it is approximately one unit but varying about that one unit level because of the difference in the accuracy of the individual charge pump units. Also shown in FIG. 6 is the phase error which during the wide bandwidth mode 158 is steady but varies 160 during the narrow bandwidth mode due to the variation in charge pump mismatch of each of the individual charge pump units.

Once the calibration has been finished i.e. at transition 162, where the calibration mode signal 120 goes from high 122 to low 124, the normal operation begins. Now the wide bandwidth mode signal 126 is in the low or narrow bandwidth mode condition and RESET signal 140 is low but now the LOAD signal 134 is high at 138 so that the identity of the charge pump unit which results in an output phase error which is closest to the output phase error of the wide bandwidth mode can be loaded into counter 70a, FIG. 5. Assuming that the charge pump CP 2, FIG. 6, was the closest it can be seen that following the next iteration when the wide bandwidth mode signal 126 goes high again 128', charge pumps CP 0 through CP 63 will all be enabled as indicated at $170_0$ through $170_{63}$. However, now, when the wide bandwidth mode signal 126 transitions back to narrow bandwidth mode 130' the enable to charge pump unit CP 2 remains high at $170_2$' and will remain high for the rest of the narrow bandwidth mode portion of the cycle. Because of this the charge pump current $I_{cp}$ 156' is steady; that is it does not have the up and down ripples present at 156 following the wide bandwidth mode 154'. In addition, the phase error 160' during this narrow bandwidth mode following the phase error 158' of the previous wide bandwidth mode is steady as it does not have the ups and downs of the phase error displayed at 160.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A charge pump system for a fast locking phase lock loop comprising:

a set of n charge pump units; and a control logic circuit for enabling said set of n charge pump units to produce up and down charge pulses with a nominal charge pump mismatch in a wide bandwidth mode and in a narrow bandwidth mode enabling at least one subset of said n charge pump units sequentially to produce an average charge pump mismatch in narrow bandwidth mode that matches the nominal charge pump mismatch in the wide bandwidth mode.

2. The charge pump system of claim 1 in which said control logic circuit sequentially enables m of said charge pump units at a time where m<n.

3. The charge pump system of claim 1 in which said control logic circuit sequentially enables m of said charge pump units at a time where m=1.

4. The charge pump system of claim 1 in which said control logic circuit sequentially enables the entire set of n of said charge pump units.

5. The charge pump system of claim 1 in which said control logic circuit enables said at least one subset of said n charge pump units randomly to produce an average charge pump mismatch in narrow bandwidth mode that matches the nominal charge pump mismatch in the wide bandwidth mode.

6. A charge pump system for a fast locking phase lock loop comprising:

a set n of charge pump units; and a control logic circuit for enabling said set of n charge pump units to produce up and down charge pulses with a nominal charge pump mismatch in a wide bandwidth mode and in a narrow bandwidth mode enabling at least one of said charge pump units whose charge pump mismatch is close to said nominal charge pump mismatch in the wide bandwidth mode.

7. The charge pump system of claim 6 in which said control logic circuit enables said charge pump unit whose charge pump mismatch is closest to said nominal charge pump mismatch.

8. The charge pump system of claim 6 further including a calibration circuit for determining which of said charge pump circuits has a charge pump mismatch close to the nominal charge pump mismatch in the wide bandwidth mode.

9. The charge pump system of claim 6 in which said calibration circuit includes a phase detector for detecting the phase error in wide bandwidth mode and for each charge pump unit in narrow bandwidth mode, and a comparator for identifying a charge pump unit whose charge pump mismatch is closest to the nominal charge pump mismatch.

10. The charge pump system of claim 6 in which said calibration circuit includes a phase detector for detecting the phase error in wide bandwidth mode and for charge pump unit in narrow bandwidth mode, and a comparator for identifying a charge pump unit whose resulting phase lock loop output phase error is closest to the output phase error when all charge pump units are active.

11. A charge pump system for a fast locking phase lock loop (PLL) comprising:

a set n of charge pump units; and a control logic circuit for enabling said set of n charge pump units to produce up and down charge pulses with a nominal PLL output phase error in a wide bandwidth mode and in a narrow bandwidth mode enabling at least one of said charge pump units whose PLL output phase error is close to said nominal PLL output phase error in the wide bandwidth mode.

12. The charge pump system of claim 11 in which said control logic circuit enables said charge pump unit whose PLL output phase error is closest to said nominal PLL output phase error.

13. The charge pump system of claim 11 further including a calibration circuit for determining which of said charge pump circuits has a PLL output phase error close to the nominal PLL output phase error in the wide bandwidth mode.

14. The charge pump system of claim 11 in which said calibration circuit includes a phase detector for detecting the phase error in wide bandwidth mode and for each charge pump unit in narrow bandwidth mode, and a comparator for identifying a charge pump unit whose PLL output phase error is closest to said nominal PLL output phase error.

15. A charge pump system for a fast locking phase lock loop comprising:

a set of n charge pump units; and a control logic circuit for enabling said set of n charge pump units to produce up and down charge pulses with a nominal charge pump mismatch in a wide bandwidth mode and in a narrow bandwidth mode enabling at least one subset of said n charge pump units randomly to produce an average charge pump mismatch in narrow bandwidth mode that matches the nominal charge pump mismatch in the wide bandwidth mode.

16. The charge pump system of claim 15 in which said control logic circuit randomly enables m of said charge pump units at a time where m<n.

17. The charge pump system of claim 16 in which said control logic circuit randomly enables m of said charge pump units at a time where m=1.

18. The charge pump system of claim 17 in which said control logic circuit randomly enables the entire set of n of said charge pump units.

* * * * *